(12) United States Patent
Li

(10) Patent No.: US 9,806,704 B2
(45) Date of Patent: Oct. 31, 2017

(54) FREQUENCY MULTIPLICATION PROCESSING METHOD AND DEVICE

(71) Applicants: Peking University Founder Group Co., Ltd., Beijing (CN); Founder Information Industry Holdings Co., Ltd., Beijing (CN); Beijing Founder Electronics Co., Ltd., Beijing (CN)

(72) Inventor: Dan Li, Beijing (CN)

(73) Assignees: Peking University Founder Group Co., Ltd., Beijing (CN); Foudner Information Industry Holdings Co., Ltd., Beijing (CN); Beijing Founder Electronics Co., Ltd., Beijing (CN)

( * ) Notice: Subject to any disclaimer, the term of this patent is extended or adjusted under 35 U.S.C. 154(b) by 171 days.

(21) Appl. No.: 14/760,119

(22) PCT Filed: Nov. 8, 2013

(86) PCT No.: PCT/CN2013/086750
§ 371 (c)(1),
(2) Date: Jul. 9, 2015

(87) PCT Pub. No.: WO2014/107986
PCT Pub. Date: Jul. 17, 2014

(65) Prior Publication Data
US 2015/0358009 A1     Dec. 10, 2015

(30) Foreign Application Priority Data
Jan. 11, 2013   (CN) .......................... 2013 1 0011748

(51) Int. Cl.
*G06F 7/68* (2006.01)
*H03K 5/156* (2006.01)
*H03K 5/00* (2006.01)

(52) U.S. Cl.
CPC ......... *H03K 5/156* (2013.01); *H03K 5/00006* (2013.01)

(58) Field of Classification Search
None
See application file for complete search history.

(56) References Cited

U.S. PATENT DOCUMENTS

2005/0012481 A1    1/2005   Kang et al.

FOREIGN PATENT DOCUMENTS

| CN | 101015986 A | 8/2007 |
| CN | 102158205 A | 8/2011 |
| CN | 202480563 U | 10/2012 |

*Primary Examiner* — David H Malzahn
(74) *Attorney, Agent, or Firm* — Brinks Gilson & Lione

(57) ABSTRACT

The present invention relates to the technical field of printing in particular, to a frequency multiplication method and device, for solving the problem of poor quality of a printed image. One method comprises: for two adjacent pulse signals output from an encoder, determining a first kind of pulse signals and a second kind of pulse signals to be inserted between the two adjacent pulse signals according to a time interval between the two adjacent pulse signals and a frequency multiplication value corresponding to a longitudinal resolution; determining a period of the first kind of pulse signals to be inserted between the two adjacent pulse signals, and determining a period of the second kind of pulse signals to be inserted between the two adjacent pulse signals; and performing frequency multiplication processing on the two adjacent pulse signals. The embodiments of the invention further improve the printing quality of images.

8 Claims, 4 Drawing Sheets

FREQUENCY MULTIPLICATION PROCESSING METHOD AND DEVICE

CROSS-REFERENCE TO RELATED APPLICATIONS

The present application is a §371 national stage application of PCT International Application No. PCT/CN2013/086750, filed Nov. 8, 2013, which application claims a right of priority to Chinese Patent Application No. 201310011748.7, filed Jan. 11, 2013, both of which are incorporated herein by reference in their entirety.

TECHNICAL FIELD

The present invention relates to the technical field of printing, and in particular, to a frequency multiplication processing method and device.

BACKGROUND

Digital printing apparatus, particularly digital printing apparatus of on-demand inkjet printing, has gained rapid development nowadays. The main imaging principle of the digital printing apparatus of on-demand inkjet printing is that, when a carrier (e.g., paper) reaches a predetermined position, a piezoelectric crystal comprised in an imaging component nozzle extrudes ink in response to a pulse signal output from an encoder, and ejects ink droplets onto a surface of the carrier for imaging.

Different application scenarios have different requirements on the resolution of an image printed by the digital printing apparatus of on-demand inkjet printing. Since a lateral resolution of the printed image is decided by a physical position of the imaging component nozzle, the lateral resolution of the printed image is fixed; a longitudinal resolution of the printed image is decided by a frequency of the pulse signal output from the encoder, that is, if the pulse signal output from the encoder has a different frequency, the printed image has a different longitudinal resolution; once the model of the encoder is fixed, the frequency of the pulse signal output from the encoder is fixed, hence the longitudinal resolution of the printed image is also fixed.

Conventionally, a flexible configuration of the longitudinal resolution of the printed image is achieved by performing frequency-division or frequency-multiplication processing on the pulse signal output from the encoder. The frequency-division value and frequency-multiplication value corresponding to the longitudinal resolution are determined according to the determined longitudinal resolution of the printed image; the pulse signal output from the encoder is frequency-multiplied according to the frequency-multiplication value corresponding to the longitudinal resolution; and the frequency-multiplied signal is frequency-divided according to the frequency-division value corresponding to the longitudinal resolution. Since there is the possibility that extra clock cycles exist during the frequency-multiplication processing, which leads to an uneven distribution of the periods of a plurality of frequency-multiplied pulse signals, this results in an uneven distribution of the periods of a plurality of frequency-divided pulse signals, and uneven pulse signals applied to the piezoelectric crystal comprised in the imaging component nozzle, so that a poor quality of the printed image results.

To sum up, at present, the method of frequency-dividing and frequency-multiplying the pulse signal output from the encoder is used to flexibly configure the longitudinal resolution of the printed image, however, the printed image has poor quality.

The description of any prior art in the specification shall not be construed as admission or suggestion: the contents therein are well known or the common knowledge in the art before the filing date or the priority date of any claim.

SUMMARY OF THE INVENTION

The embodiments of the invention provide a frequency multiplication processing method and device, for solving the problem of poor printed image quality where the typical method of frequency-dividing and frequency-multiplying the pulse signal output from the encoder is used.

An embodiment of the present invention provides a frequency multiplication processing method, comprising:

for two adjacent pulse signals output from an encoder, determining a first kind of pulse signals and a second kind of pulse signals to be inserted between the two adjacent pulse signals according to a time interval between the two adjacent pulse signals and a frequency multiplication value corresponding to a longitudinal resolution;

determining a period of the first kind of pulse signals to be inserted between the two adjacent pulse signals according to a first pulse period corresponding to the two adjacent pulse signals, and determining a period of the second kind of pulse signals to be inserted between the two adjacent pulse signals according to a second pulse period corresponding to the two adjacent pulse signals; and performing frequency multiplication processing on the two adjacent pulse signals according to the determined period of the first kind of pulse signals and period of the second kind of pulse signals.

The present invention provides a frequency multiplication processing device, comprising:

a processing module being configured to, for two adjacent pulse signals output from an encoder, determine a first kind of pulse signals and a second kind of pulse signals to be inserted between the two adjacent pulse signals according to a time interval between the two adjacent pulse signals and a frequency multiplication value corresponding to a longitudinal resolution;

a determining module being configured to determine a period of the first kind of pulse signals to be inserted between the two adjacent pulse signals according to a first pulse period corresponding to the two adjacent pulse signals, and determine a period of the second kind of pulse signals to be inserted between the two adjacent pulse signals according to a second pulse period corresponding to the two adjacent pulse signals; and a frequency multiplication module being configured to perform frequency multiplication processing on the two adjacent pulse signals according to the determined period of the first kind of pulse signals and period of the second kind of pulse signals.

In the embodiments of the invention, for two adjacent pulse signals output from an encoder, a first kind of pulse signals and a second kind of pulse signals to be inserted between the two adjacent pulse signals are determined according to a time interval between the two adjacent pulse signals and a frequency multiplication value corresponding to a longitudinal resolution; a period of the first kind of pulse signals to be inserted between the two adjacent pulse signals is determined according to a first pulse period corresponding to the two adjacent pulse signals, and a period of the second kind of pulse signals to be inserted between the two adjacent pulse signals is determined according to a second pulse period corresponding to the two adjacent pulse signals; and frequency multiplication processing on the two adjacent pulse signals is performed according to the determined period of the first kind of pulse signals and period of the second kind of pulse signals. Since the extra clock cycles are assigned as evenly as possible to all the pulse signals to be inserted between the two adjacent pulse signals, the first kind of pulse signals whose period is the first pulse period are evenly distributed among all the pulse signals to be inserted between the two adjacent pulse signals (or the second kind of pulse signals whose period is the second pulse period are evenly distributed among all the pulse signals to be inserted between the two adjacent pulse signals), such that the plurality of frequency-divided pulse signals have evenly distributed periods, and the pulse signals applied to the piezoelectric crystal comprised in the imaging component nozzle are even, thereby further improving the printing quality of images.

BRIEF DESCRIPTION OF THE ACCOMPANYING DRAWINGS

DETAILED DESCRIPTION OF THE EMBODIMENTS

Various illustrative embodiments of the present invention are described in detail now with reference to the accompanying drawings. It should be noted that, unless otherwise stated, relative arrangements, digital expressions and values of the components and steps set forth in the embodiments do not limit the scope of the invention.

The descriptions of at least one illustrative embodiment below in fact are merely descriptive and shall not be construed as any limitation to the invention and its applications or uses.

Those techniques, methods and devices known to those skilled in the art possibly will not be discussed in detail herein, nonetheless, all such techniques, methods and devices shall be regarded as a part of the granted specification where appropriate.

In all the examples shown and discussed here, any specific value shall be construed as merely illustrative but not limiting. Therefore, other examples of the illustrative embodiments may have different values.

In the embodiments of the invention, for two adjacent pulse signals output from an encoder, a first kind of pulse signals and a second kind of pulse signals to be inserted between the two adjacent pulse signals are determined according to a time interval between the two adjacent pulse signals and a frequency multiplication value corresponding to a longitudinal resolution; a period of the first kind of pulse signals to be inserted between the two adjacent pulse signals is determined according to a first pulse period corresponding to the two adjacent pulse signals, and a period of the second kind of pulse signals to be inserted between the two adjacent pulse signals is determined according to a second pulse period corresponding to the two adjacent pulse signals; and frequency multiplication processing on the two adjacent pulse signals is performed according to the determined period of the first kind of pulse signals and period of the second kind of pulse signals. Since the extra clock cycles are assigned as evenly as possible to all the pulse signals to be inserted between the two adjacent pulse signals, the first kind of pulse signals whose period is the first pulse period are evenly distributed among all the pulse signals to be inserted between the two adjacent pulse signals (or the second kind of pulse signals whose period is the second pulse period are evenly distributed among all the pulse signals to be inserted between the two adjacent pulse signals), such that the plurality of frequency-divided pulse signals have evenly distributed periods, and the pulse signals applied to the piezoelectric crystal comprised in the imaging component nozzle are even, thereby further improving the printing quality of images.

The embodiments of the invention will be described in further detail below according to the accompanying drawings.

Figure 1:
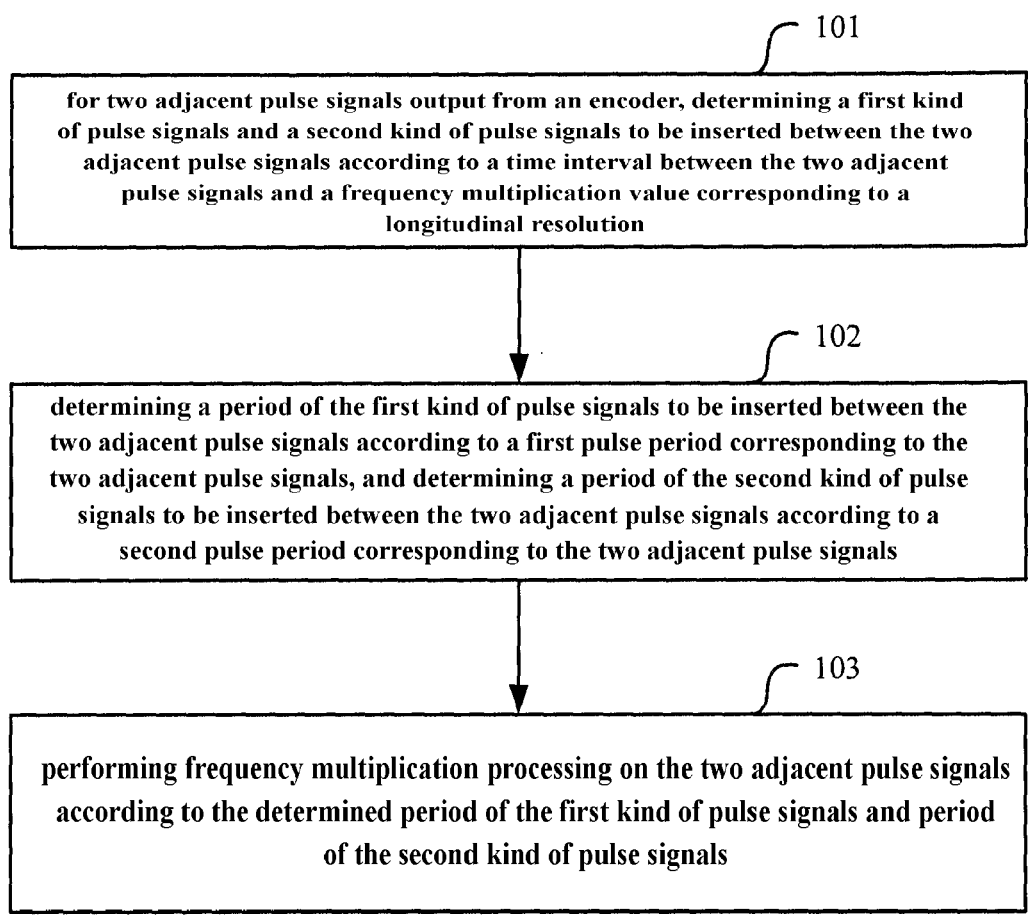
FIG. 1 is a schematic diagram showing the frequency multiplication processing method according to an embodiment of the invention.

As shows in FIG. 1, the frequency multiplication processing method according to an embodiment of the invention comprises the following steps:

step 101, in which, for two adjacent pulse signals output from an encoder, a first kind of pulse signals and a second kind of pulse signals to be inserted between the two adjacent pulse signals are determined according to a time interval between the two adjacent pulse signals and a frequency multiplication value corresponding to a longitudinal resolution;

step 102, in which a period of the first kind of pulse signals to be inserted between the two adjacent pulse signals is determined according to a first pulse period corresponding to the two adjacent pulse signals, and a period of the second kind of pulse signals to be inserted between the two adjacent pulse signals is determined according to a second pulse period corresponding to the two adjacent pulse signals; and step 103, in which frequency multiplication processing is performed on the two adjacent pulse signals according to the determined period of the first kind of pulse signals and period of the second kind of pulse signals.

The encoder according to the embodiment of the invention is used for outputting a plurality of pulse signals, and when the encoder is an encoder having a fixed number of lines, the encoder will give a fixed number of pulse signals when rotating one cycle, The frequency-multiplication value and the frequency-division value are determined according to the configured longitudinal resolution of the printed image.

Preferably, before determining a first kind of pulse signals and a second kind of pulse signals to be inserted between the two adjacent pulse signals in step 101, an embodiment of the present invention further determines if there exist extra clock cycles according to the time interval between the two adjacent pulse signals and the frequency multiplication value; if there do not exist extra clock cycles, there is no need to perform the frequency-multiplication processing according to the embodiment of the invention; and if there exist extra clock cycles, the extra clock cycles are determined.

The time interval between the two adjacent pulse signals can be stored in a subject that carries out the embodiment according to the invention, or stored in other entities, and when needed, it is invoked by the subject that carries out the embodiment according to the invention; when the time interval between the two adjacent pulse signals changes, the stored time interval is replaced with the changed time interval.

For example, the time interval between the two adjacent pulse signals is K system clock cycles, the configured frequency multiplication value is M, then it is determined that mod (K/M)=R; if R=0, then it is determined that there are no extra clock cycles, and it is not necessary to perform the frequency multiplication processing according to the embodiment of the invention; if R≠0, then it is determined that there are extra clock cycles and there are R extra clock cycles.

Preferably, in step 101, determining a first kind of pulse signals and a second kind of pulse signals to be inserted between the two adjacent pulse signals comprises:

determining a total number of pulse signals to be inserted between two adjacent pulse signals according to the frequency multiplication value.

The first kind of pulse signals and the second kind of pulse signals to be inserted between the two adjacent pulse signals are determined according to the principle that extra clock cycles are distributed as evenly as possible among all pulse signals to be inserted between the two adjacent pulse signals.

A sum of the number of the first kind of pulse signals and the number of the second kind of pulse signals is the total number of the pulse signals to be inserted between the two adjacent pulse signals.

Preferably, in step 101, determining a first kind of pulse signals and a second kind of pulse signals to be inserted between the two adjacent pulse signals comprises:

S1: in which a candidate first kind of pulse signals from all the pulse signals to be inserted between the two adjacent pulse signals is determined according to the time interval between the two adjacent pulse signals and the frequency multiplication value;

S2: in which a first kind of pulse signals from the candidate first kind of pulse signals is determined according to a binary value corresponding to a remainder of the time interval and the frequency multiplication value; and S3: in which all the pulse signals to be inserted between the two adjacent pulse signals except the first kind of pulse signals are used as the second kind of pulse signals.

Preferably, in step S1, a candidate first kind of pulse signals is determined from all the pulse signals to be inserted between the two adjacent pulse signals according to the following equation:

$$Y(i)=M*(2*j+1)/2^{i+1}$$

wherein a (Y(i)−1)th pulse signal among all the pulse signals to be inserted is a candidate first kind of pulse signals (since during frequency multiplication processing, one of the two adjacent pulse signals serves as the first pulse signal obtained after the frequency multiplication processing, the (Y(i)−1)th pulse signal among all the pulse signals to be inserted is a Y(i)th pulse signal obtained after the frequency multiplication processing), M is the frequency multiplication value, 0≤i<m, 0≤j<$2^i$ (i.e., when i takes each value among 0~(m−1), j takes a value among 0~($2^i$−1)), and m is a number of bits of the binary corresponding to the remainder of the time interval and the frequency multiplication value.

Preferably, in step S2, determining a first kind of pulse signals from the candidate first kind of pulse signals comprises:

determining an ith bit value R(i) of the binary corresponding to the remainder of the time interval and the frequency multiplication value, and when R(i) is a particular value, determining, from the candidate first kind of pulse signals, the (Y(i)−1)th pulse signal among all the pulse signals to be inserted as the first kind of pulse signals.

Preferably, the particular value can be set as needed, e.g., 1.

Preferably, for the (Y(i)−1)th pulse signal to be inserted that is determined as the first kind of pulse signals, if Y(i) is not divisible, Y(i) may be rounded up to an integer, or rounded down to an integer, or rounded.

Preferably, step 102 determines the first pulse period and the second pulse period corresponding to the two adjacent pulse signals according to the following step:

determining the first pulse period and the second pulse period according to the frequency multiplication value and the time interval.

Preferably, the first pulse period and the second pulse period are determined according to a quotient of the time interval and the frequency multiplication value.

For example, the time interval between two adjacent pulse signals is K system clock cycles, the configured frequency multiplication value is M, the quotient of the time interval and the frequency multiplication value is K/M=Q; then the first pulse period is determined as Q, and the second pulse period is (Q+1), or the first pulse period is (Q+1), and the second pulse period is Q.

Preferably, in step 102, determining a period of the first kind of pulse signals to be inserted between the two adjacent pulse signals according to a first pulse period corresponding to the two adjacent pulse signals comprises:

determining the period of the first kind of pulse signals as the first pulse period.

Preferably, the period of the first kind of pulse signals refers to a period from a rising edge of the first kind of pulse signals to, a rising edge of a next hop pulse signal adjacent to the first kind of pulse signals which is to be inserted between two adjacent pulse signals.

Preferably, in step 102, determining a period of the second kind of pulse signals to be inserted between the two adjacent pulse signals according to a second pulse period corresponding to the two adjacent pulse signals comprises:

determining the period of the second kind of pulse signals as the second pulse period.

Preferably, the period of the second kind of pulse signals refers to a period from a rising edge of the second kind of pulse signals to, a rising edge of a next hop pulse signal adjacent to the second kind of pulse signals which is to be inserted between two adjacent pulse signals.

It should be noted that, the invention only discusses the frequency multiplication processing for two adjacent pulse signals among a plurality of pulse signals output from the encoder, however, the frequency multiplication processing of any other two adjacent pulse signals is similar to the embodiment of the invention and thus the description thereof is omitted here.

Preferably, in step 103, performing frequency multiplication processing on the two adjacent pulse signals according to the determined period of the first kind of pulse signals and period of the second kind of pulse signals comprises:

inserting the first kind of pulse signals and the second kind of pulse signals between the two adjacent pulse signals according to the first pulse period corresponding to the first kind of pulse signals and the second pulse period corresponding to the second kind of pulse signals.

Preferably, after performing frequency multiplication process on the two adjacent pulse signals, step 103 further comprises:

performing frequency division processing on the two adjacent pulse signals, and the first kind of pulse signals and the second kind of pulse signals to be inserted between the two adjacent pulse signals, according to the frequency division value corresponding to the longitudinal resolution.

Figure 2:
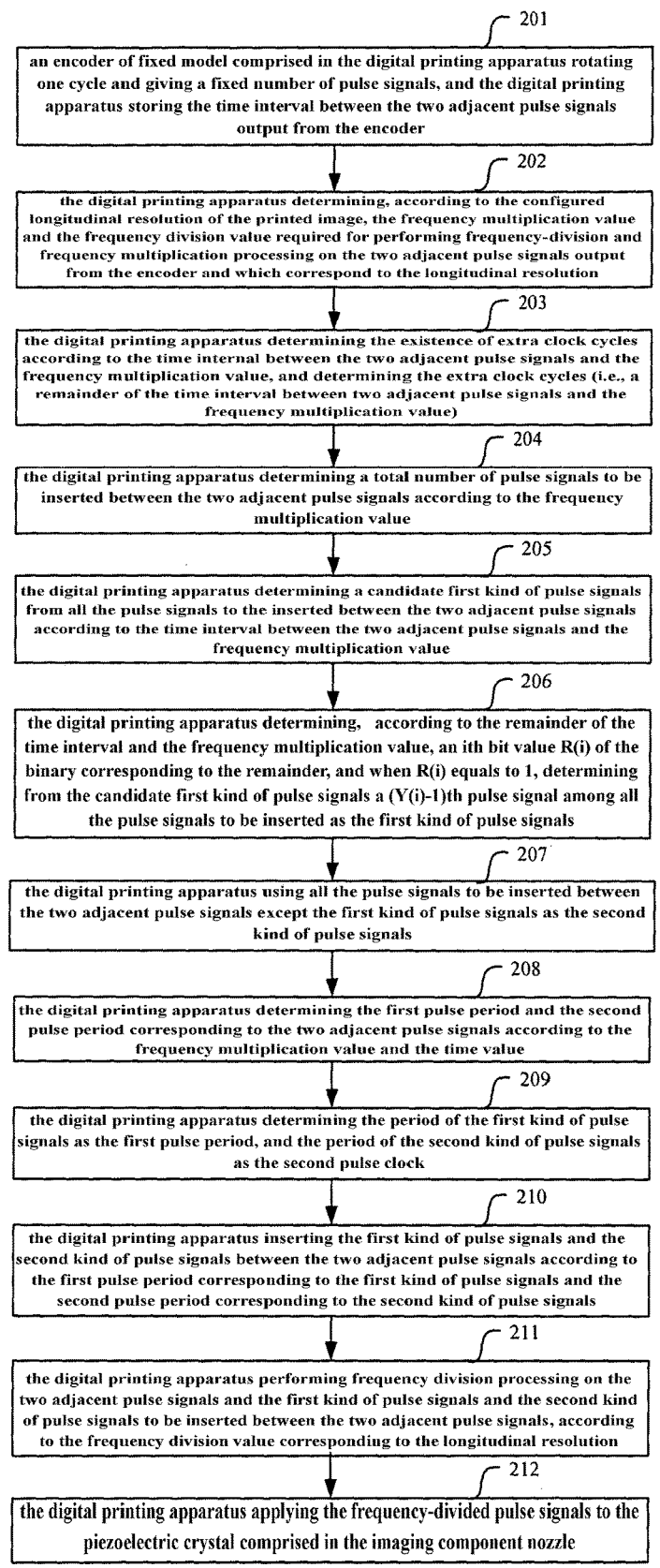
FIG. 2 is a schematic diagram showing a flowchart of the detailed frequency multiplication processing method according to an embodiment of the invention.

As shown in FIG. 2, the detailed frequency multiplication processing method according to the embodiment of the invention comprises the following steps.

A step 201: an encoder of fixed model comprised in the digital printing apparatus rotates one cycle and gives a fixed number of pulse signals, and the digital printing apparatus stores the time interval between the two adjacent pulse signals output from the encoder.

A step 202: the digital printing apparatus determines, according to the configured longitudinal resolution of the printed image, the frequency multiplication value and the frequency division value required for performing frequency-division and frequency multiplication processing on the two adjacent pulse signals output from the encoder and which corresponds to the longitudinal resolution.

A step 203: the digital printing apparatus determines the existence of extra clock cycles according to the time internal between the two adjacent pulse signals and the frequency multiplication value, and determines the extra clock cycles (i.e., a remainder of the time interval between two adjacent pulse signals and the frequency multiplication value).

For example, the time interval between two adjacent pulse signals is 1000 T (where T is the system clock period), the configured frequency multiplication value is 14, then mod (1000/14)=6, so it is determined that there exist extra clock cycles, and that there are six extra clock cycles.

A step 204: the digital printing apparatus determines a total number of pulse signals to be inserted between the two adjacent pulse signals according to the frequency multiplication value.

For example, if the configured frequency multiplication value is 14, then it is determined that the total number of the pulse signals to be inserted between the two adjacent pulse signals is 13; if there exist 6 extra clock cycles, then it is required that the six extra clock cycles are distributed as evenly as possible among the 13 pulses to be inserted between the two adjacent pulse signals.

A step 205: the digital printing apparatus determines a candidate first kind of pulse signals from all pulse signals to be inserted between the two adjacent pulse signals according to the time interval between the two adjacent pulse signals and the frequency multiplication value.

Preferably, the digital printing apparatus determines a candidate first kind of pulse signals from all the pulse signals to be inserted between the two adjacent pulse signals according to the following equation:

$$Y(i)=M*(2*j+1)/2^{i+1}$$

wherein, a (Y(i)−1)th pulse signal among all the pulse signals to be inserted is a candidate first kind of pulse signals (i.e., the Y(i)th pulse signal obtained after the frequency multiplication processing is a candidate first kind of pulse signals).

For example, the configured frequency multiplication value M is 14, and the time interval between the two adjacent pulse signals is 1000 T, then the remainder of the time interval and the frequency multiplication value is R=6; R is expressed by binary as 110, so the number of bits of the binary corresponding to R is m=3.

Since $0 \leq i < m$, $0 \leq j < 2^i$, when i takes a value of 0, j takes a value of 0; when i takes a value of 1, j takes a value of 0 and 1; when i takes a value of 2, j takes a value of 0, 1, 2 and 3.

When i takes a value of 0 and j takes a value of 0, $Y(0)=M*(1/2)$;

when i takes a value of 1, and j takes a value of 0, $Y(1)=M*(1/4)$; when i takes a value of 1, and j takes a value of 1, $Y(1)=M*(3/4)$;

when i takes a value of 2, and j takes a value of 0, $Y(2)=M*(1/8)$; when i takes a value of 2, and j takes a value of 1, $Y(2)=M*(3/8)$; when i takes a value of 2, and j takes a value of 2, $Y(2)=M*(5/8)$; when i takes a value of 2, and j takes a value of 3, $Y(2)=M*(7/8)$;

thus, the following pulse signals obtained after the frequency multiplication processing are candidate first kind of pulse signals: $Y(0)=M*(1/2)$; $Y(1)=M*(1/4)$; $Y(1)=M*(3/4)$; $Y(2)=M*(1/8)$; $Y(2)=M*(3/8)$; $Y(2)=M*(5/8)$; $Y(2)=M*(7/8)$.

Since one of the two adjacent pulse signals serves as the first pulse signal obtained after the frequency multiplication processing, the $Y(0)=M*(1/2)$th pulse signal obtained after the frequency multiplication processing is the $(M*(1/2)-1)$th pulse signal to be inserted, the implementations of other candidate first kind of pulse signals are similar to the implementation of $Y(0)=M*(1/2)$ according to the embodiment of the invention and thus the description thereof is omitted here.

A step 206: the digital printing apparatus determines, according to the remainder of the time interval and the frequency multiplication value, an ith value R(i) of the binary corresponding to the remainder, and when R(i) equals to 1, determines from the candidate first kind of pulse signals, a (Y(i)−1)th pulse signal among all the pulse signals to be inserted as the first kind of pulse signals.

For example, the configured frequency multiplication value M is 14, and the time interval between the two adjacent pulse signals is 1000T, then the remainder of the time interval and the frequency multiplication value is R=6; R is expressed by binary as 110; R(i) is the value of the ith bit when R is expressed by binary, then R(0)=0, R(1)=1, and R(2)=1.

Since R(0)=0, the (Y(0)−1)th pulse signal to be inserted is not the first kind of pulse signals.

Since R(1)=1, the (Y(1)−1)th pulse signal to be inserted is the first kind of pulse signals, that is, the $(M*(1/4)-1)$th and $(M*(3/4)-1)$th pulse signals are the first kind of pulses signals.

Since R(2)=1, the (Y(2)−1)th pulse signal to be inserted is the first kind of pulse signals, that is, the $(M*(1/8)-1)$th, $(M*(3/8)-1)$th, $(M*(5/8)-1)$th and $(M*(7/8)-1)$th pulse signals are the first kind of pulse signals.

Therefore, there are a total of six (i.e., the remainder of the time interval and the frequency multiplication value) first kind of pulse signals; by rounding up the determined Y(1) and Y(2), it is determined that the $1^{st}$, $3^{rd}$, $5^{th}$, $8^{th}$, $10^{th}$, $12^{th}$ pulse signals to be inserted are the first kind of pulse signals, that is, the $2^{nd}$, $4^{th}$, $6^{th}$, $9^{th}$, $11^{th}$, $13^{th}$ pulse signals obtained after the frequency multiplication processing are the first kind of pulse signals.

Figure 3:
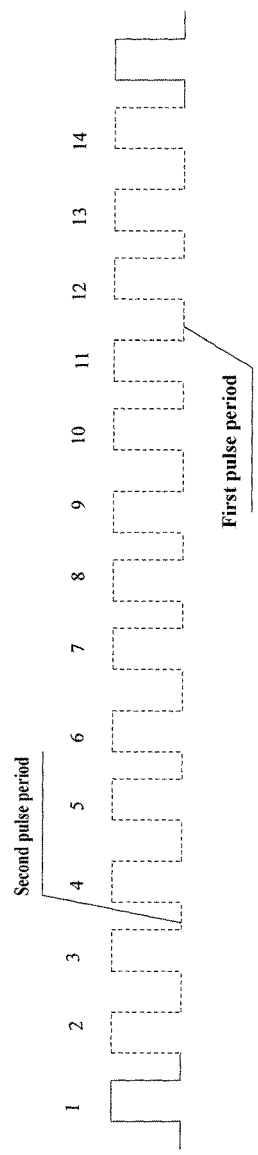
FIG. 3 is a schematic diagram showing the frequency-multiplied signal according to an embodiment of the invention.

As shown in FIG. 3, assuming that, the square waves shown by solid lines are two adjacent pulse signals output from the encoder, and the square waves shown by dotted lines are all the pulse signals to be inserted between two adjacent pulse signals, then one of the two adjacent pulse signals serves as the first pulse signal obtained after the frequency multiplication processing.

As a result, the $2^{nd}$, $4^{th}$, $6^{th}$, $9^{th}$, $11^{th}$, $13^{th}$ pulse signals obtained after the frequency multiplication processing are the first kind of pulse signals.

A step 207: the digital printing apparatus uses all the pulse signals to be inserted between the two adjacent pulse signals except the first kind of pulse signals as the second kind of pulse signals.

As shown in FIG. 3, the $3^{rd}$, $5^{th}$, $7^{th}$, $8^{th}$, $10^{th}$, $12^{th}$ pulse signals obtained after the frequency multiplication processing are the second kind of pulse signals.

A step 208: the digital printing apparatus determines the first pulse period and the second pulse period corresponding to the two adjacent pulse signals according to the frequency multiplication value and the time interval value.

For example, the configured frequency multiplication value M is 14, the time interval between two adjacent pulse signals is 1000T, then the quotient of the time interval and the frequency multiplication value is 1000/14=71, so it is determined that the first pulse period is 71+1=72 clock cycles, and the second pulse period is 71 clock cycles.

A step 209: the digital printing apparatus determines the period of the first kind of pulse signals as the first pulse period, and determines the period of the second kind of pulse signals as the second pulse clock.

As shown in FIG. 3, the period of the first kind of pulse signals is described by taking the second pulse signal obtained after the frequency multiplication processing as an example, wherein the period of the second pulse signal refers to the time interval from a rising edge of the second pulse signal to a rising edge of the third pulse signal obtained after the frequency multiplication processing.

Where the rising time is greater than 0, the period of the second pulse signal can be set as needed as the time interval between a midpoint of a rising straight line (or curved line) of the second pulse signal to a midpoint of a rising straight line (or curved line) of the third pulse signal obtained after the frequency multiplication process, and the periods of other pulse signals can be set similarly.

A step 210: the digital printing apparatus inserts the first kind of pulse signals and the second kind of pulse signals between the two adjacent pulse signals according to the first pulse period corresponding to the first kind of pulse signals and the second pulse period corresponding to the second kind of pulse signals.

For example, the configured frequency multiplication value M is 14, the time interval between the two adjacent pulse signals is 1000T, then it is determined that the $1^{st}$, $3^{rd}$, $5^{th}$, $8^{th}$, $10^{th}$, $12^{th}$ pulse signals to be inserted are the first kind of pulse signals, the $2^{nd}$, $4^{th}$, $6^{th}$, $7^{th}$, $9^{th}$, $11^{th}$ pulse signals to be inserted are the second kind of pulse signals, and the first pulse period corresponding to the first kind of pulse signals is 72 clock cycles, and the second pulse period corresponding to the second kind of pulse signals is 71 clock cycles.

Then, based on the determined period of the $1^{st}$, $3^{rd}$, $5^{th}$, $8^{th}$, $10^{th}$, $12^{th}$ pulse signals to the inserted being 72 clock cycles, and that of the $2^{nd}$, $4^{th}$, $6^{th}$, $7^{th}$, $9^{th}$, $11^{th}$ pulse signals to the inserted being 71 clock cycles, the $1^{st}$, $2^{nd}$, $3^{rd}$, $4^{th}$, $5^{th}$, $6^{th}$, $7^{th}$, $8^{th}$, $9^{th}$, $10^{th}$, $11^{th}$, $12^{th}$ pulse signals are inserted between the two adjacent pulse signals. The two adjacent pulse signals subject to 14 frequency multiplied processing are shown in FIG. 3.

A step 211: the digital printing apparatus performs frequency division processing on the two adjacent pulse signals, and the first kind of pulse signals and the second kind of pulse signals to be inserted between the two adjacent pulse signals, according to the frequency division value corresponding to the longitudinal resolution.

The two adjacent pulse signals and the first kind of pulse signals and the second kind of pulse signals to be inserted between the two adjacent pulse signals after the frequency multiplication processing are shown in FIG. 3.

A step 212: the digital printing apparatus applies the frequency-divided pulse signals to the piezoelectric crystal comprised in the imaging component nozzle.

Based on the same inventive concept, the embodiments of the invention further provide a frequency multiplication processing device and a digital printing apparatus. Since the principle used by such device and apparatus to solve the problem is the same as the method according to the embodiment of the invention, the description thereof which is repetitious with the afore-mentioned will be omitted.

Figure 4:
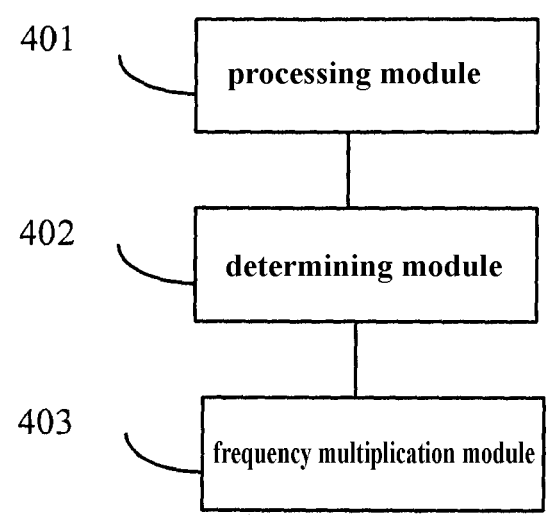
FIG. 4 is a schematic diagram showing a structure of the frequency multiplication processing device according to an embodiment of the invention.

FIG. 4 is a schematic diagram showing a structure of the frequency multiplication processing device according to an embodiment of the invention. As shown in the figure, the frequency multiplication processing device according to the embodiment of the invention comprises:

a processing module 401, which is used to, for two adjacent pulse signals output from an encoder, determine a first kind of pulse signals and a second kind of pulse signals to be inserted between the two adjacent pulse signals according to a time interval between the two adjacent pulse signals and a frequency multiplication value corresponding to a longitudinal resolution;

a determining module 402, which is used to determine the period of the first kind of pulse signals to be inserted between the two adjacent pulse signals according to a first pulse period corresponding to the two adjacent pulse signals, and determine the period of the second kind of pulse signals to be inserted between the two adjacent pulse signals according to a second pulse period corresponding to the two adjacent pulse signals; and a frequency multiplication module 403, which is used to perform frequency multiplication processing on the two adjacent pulse signals according to the determined period of the first kind of pulse signals and period of the second kind of pulse signals.

Preferably, the processing module 401, specifically, determines a candidate first kind of pulse signals from all the pulse signals to be inserted between the two adjacent pulse signals according to the time interval between the two adjacent pulse signals and the frequency multiplication value; determines a first kind of pulse signals from the candidate first kind of pulse signals according to a binary value corresponding to a remainder of the time interval and the frequency multiplication value; and uses all the pulse signals to be inserted between the two adjacent pulse signals except the first kind of pulse signals as the second kind of pulse signals.

Preferably, the processing module 401 determines a candidate first kind of pulse signals from all the pulse signals to be inserted between the two adjacent pulse signals according to the following equation:

$$Y(i)=M*(2*j+1)/2^{i+1}$$

wherein a (Y(i)−1)th pulse signal among all the pulse signals to be inserted is a candidate first kind of pulse signals, M is a frequency multiplication value, $0 \le i < m$, $0 \le j < 2^i$ and m is a number of bits of the binary corresponding to the remainder of the time interval and the frequency multiplication value.

Preferably, the processing module 401 specifically determines the value of the ith bit R(i) of the binary corresponding to the remainder of the time interval and the frequency multiplication value, and when R(i) is a particular value, determines the (Y(i)−1)th pulse signal from the candidate first kind of pulse signals as the first kind of pulse signals.

Preferably, the determining module 402 specifically determines the first pulse period and the second pulse period according to the frequency multiplication value and the time interval.

The frequency multiplication device and the encoder according to the embodiments of the invention can be integrated together or can be separate from each other.

The present disclosure further provides one or more computer readable medium with computer executable instructions, which when executed by the computer, performs a frequency multiplication processing method comprising: for two adjacent pulse signals output from an encoder, determining a first kind of pulse signals and a second kind of pulse signals to be inserted between the two adjacent pulse signals according to a time interval between the two adjacent pulse signals and a frequency multiplication value corresponding to a longitudinal resolution; determining a period of the first kind of pulse signals to be inserted between the two adjacent pulse signals according to a first pulse period corresponding to the two adjacent pulse signals, and determining a period of the second kind of pulse signals to be inserted between the two adjacent pulse signals according to a second pulse period corresponding to the two adjacent pulse signals; and performing frequency multiplication processing on the two adjacent pulse signals according to the determined period of the first kind of pulse signals and period of the second kind of pulse signals.

The present disclosure further provides a computer comprising one or more computer readable medium with computer executable instructions, which when executed by the computer, performs the frequency multiplication processing method.

Illustrative Operating Environment

The computing device described herein includes hardware, comprising one or more processors or processing units, a system memory and a computer readable medium in a certain form. As a non-limiting example, the computer readable medium comprises computer storage medium and communication medium. The computer storage medium comprises volatile and non-volatile, movable and immovable medium implemented by any method or technique for storing information such as computer readable instructions, data structure, program module or other data. The communication medium generally embodies the computer readable instructions, data structure, program module or other data with such modulated data signals as carrier or other transmission mechanisms, and comprises any information transfer medium. A combination of any one of the above is also included within the range of the computer readable medium.

The computer may operate in a networked environment by using a logic connection to one or more remote computer. Although the invention is described in combination with the illustrative computing system environment, the embodiments of the invention can be used in a lot of other universal or specialized computing system environment or configuration. The computing system environment is not intended to limit the use range or function of any aspect of the invention. Furthermore, the computer environment should not be construed as having any dependence or requirement on any component shown in the illustrative operating environment or a combination thereof. Examples of the well known computing system, environment and/or configuration adapted to the various aspects of the invention include but are not limited to: a personal computer, a server computer, a handheld or laptop device, a multi-processor system, a microprocessor-based system, a set top box, a programmable consumer electronic product, a mobile telephone, a network PC, a small scale computer, a large scale computer, a distributed computing environment comprising any one of the above systems or devices.

The various embodiments of the invention can be described in a general context of computer executable instructions such as program modules executed by one or more computing device. The computer executable instructions, as software, can be organized into one or more computer executable component or module. In general, the program module comprises (but not limited to), routine, program, object, component, and data structure for performing a particular task or realizing a particular abstract data type. The various aspects of the invention can be implemented by using any number of such components or modules and their organizations. For example, the various aspects of the invention are not limited only to particular computer executable instructions or particular components or modules shown in the accompanying drawings and described herein. The other embodiments of the invention may comprise different computer executable instructions or components having more or less functions than what is shown and described herein. The various aspects of the invention can be implemented in a distributed computing environment in which the tasks are performed by remote processing devices linked via the communication network. In the distributed computing environment, the program modules can be located in local and remote computer storage mediums including the memory storage device.

As will be appreciated by one skilled in the art, aspects of the present invention may be embodied as a system, method or computer program product. Accordingly, aspects of the present invention may take the form of an entirely hardware embodiment, an entirely software embodiment or an embodiment combining software and hardware aspects. Furthermore, aspects of the present invention may take the form of a computer program product embodied in one or more computer readable medium(s) (comprising but not limited to, a disk memory, CD-ROM, an optical memory) having computer readable program code embodied thereon.

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Although the descriptions of the preferred embodiments of the present invention have been presented for purposes of illustration, other modifications and variations to the embodiments can be made by those of ordinary skill in the art once they know basic inventive concepts. Therefore, the attached claims are intended to be explained as comprising the preferred embodiments and all the modifications and variations falling within the scope of the invention.

Various modifications and changes will be apparent to those of ordinary skill in the art without departing from the scope and spirit of the invention. Therefore, if the modifications and changes of the invention fall within the scope of the claims and their equivalents of the invention, the invention is intended to comprise all these modification and changes.

The invention claimed is:

1. A frequency multiplication processing method, comprising the steps of:
for two adjacent pulse signals output from an encoder, determining a first kind of pulse signals and a second kind of pulse signals to be inserted between the two adjacent pulse signals according to a time interval between the two adjacent pulse signals and a frequency multiplication value corresponding to a longitudinal resolution, wherein a sum of the number of the first kind of pulse signals and the number of the second kind of pulse signals is the total number of the pulse signals to be inserted between the two adjacent pulse signals;
determining a period of the first kind of pulse signals to be inserted between the two adjacent pulse signals and a period of the second kind of pulse signals to be inserted between the two adjacent pulse signals; and
inserting the first kind of pulse signals and the second kind of pulse signals between the two adjacent pulse signals according to the determined period of the first kind of pulse signals and period of the second kind of pulse signals.

2. The method of claim 1, wherein determining a first kind of pulse signals and a second kind of pulse signals to be inserted between the two adjacent pulse signals comprises:
determining a candidate first kind of pulse signals from the total number of pulse signals to be inserted between the two adjacent pulse signals, according to the time interval between the two adjacent pulse signals and the frequency multiplication value;
determining a first kind of pulse signals from the candidate first kind of pulse signals according to a binary value corresponding to a remainder of the time interval and the frequency multiplication value; and
using the total number of pulse signals to be inserted between the two adjacent pulse signals except the first kind of pulse signals as the second kind of pulse signals;
wherein the candidate first kind of pulse signals is determined from the total number of pulse signals to be inserted between the two adjacent pulse signals according to the following equation:

$$Y(i)=M*(2*j+1)/2^{i+1}$$

wherein a (Y(i)−1)th pulse signal among the total number of pulse signals to be inserted is the candidate first kind of pulse signals, M is the frequency multiplication value, $0 \leq i < m$, $0 \leq j < 2^i$, and m is a number of bits of the binary corresponding to the remainder of the time interval and the frequency multiplication value.

3. The method of claim 2, wherein determining a first kind of pulse signals from the candidate first kind of pulse signals comprises:
determining the value of an ith bit R(i) of the binary corresponding to the remainder of the time interval and the frequency multiplication value, and when R(i) is a particular value, determining the (Y(i)−1)th pulse signal from the candidate first kind of pulse signals as the first kind of pulse signals.

4. The method of claim 1, wherein the period of the first kind of pulse signals and the period of the second kind of pulse signals is determined according to the following step:
determining the period of the first kind of pulse signals and the period of the second kind of pulse signals according to the frequency multiplication value and the time interval.

5. A frequency multiplication processing device comprising:
a processing module being configured to, for two adjacent pulse signals output from an encoder, determine a first kind of pulse signals and a second kind of pulse signals to be inserted between the two adjacent pulse signals according to a time interval between the two adjacent pulse signals and a frequency multiplication value corresponding to a longitudinal resolution, wherein a sum of the number of the first kind of pulse signals and the number of the second kind of pulse signals is the total number of the pulse signals to be inserted between the two adjacent pulse signals;
a determining module being configured to determine the period of the first kind of pulse signals to be inserted between the two adjacent pulse signals, and the period of the second kind of pulse signals to be inserted between the two adjacent pulse signals; and
a frequency multiplication module being configured to insert the first kind of pulse signals and the second kind of pulse signals between the two adjacent pulse signals according to the determined period of the first kind of pulse signals and period of the second kind of pulse signals.

6. The device of claim 5, wherein the processing module is further configured to determine a candidate first kind of pulse signals from the total number of pulse signals to be inserted between the two adjacent pulse signals according to the time interval between the two adjacent pulse signals and the frequency multiplication value; determine a first kind of pulse signals from the candidate first kind of pulse signals according to a binary value corresponding to a remainder of the time interval and the frequency multiplication value; and use the total number of pulse signals to be inserted between the two adjacent pulse signals except the first kind of pulse signals as the second kind of pulse signals;
wherein the processing module is further configured to determine a candidate first kind of pulse signals from the total number of pulse signals to be inserted between the two adjacent pulse signals according to the following equation:

$$Y(i)=M*(2*j+1)/2^{i+1}$$

wherein a (Y(i)−1)th pulse signal among the total number of pulse signals to be inserted is the candidate first kind of pulse signals, M is the frequency multiplication value, $0 \leq i < m$, $0 \leq j < 2^i$, and m is a number of bits of the binary corresponding to the remainder of the time interval and the frequency multiplication value.

7. The device of claim 6, wherein the processing module is further configured to determine the value of an ith bit R(i) of the binary corresponding to the remainder of the time interval and the frequency multiplication value, and when R(i) is a particular value, the processing module is further configured to determine the (Y(i)−1)th pulse signal from the candidate first kind of pulse signals as the first kind of pulse signals.

8. The device of claim 5, wherein the determining module is further configured to determine the period of the first kind of pulse signals and the period of the second kind of pulse signals according to the frequency multiplication value and the time interval.

* * * * *